United States Patent
Takasu

(10) Patent No.: US 8,352,814 B2
(45) Date of Patent: Jan. 8, 2013

(54) ELECTRONIC CONTROL APPARATUS

(75) Inventor: Masashige Takasu, Owariasahi (JP)

(73) Assignee: Denso Corporation, Kariya (JP)

( * ) Notice: Subject to any disclaimer, the term of this patent is extended or adjusted under 35 U.S.C. 154(b) by 91 days.

(21) Appl. No.: 12/652,220

(22) Filed: Jan. 5, 2010

(65) Prior Publication Data

US 2010/0180167 A1     Jul. 15, 2010

(30) Foreign Application Priority Data

Jan. 9, 2009  (JP) ................................. 2009-003584

(51) Int. Cl.
*G11C 29/00* (2006.01)

(52) U.S. Cl. .......................... 714/722; 714/718; 714/807

(58) Field of Classification Search .......... 714/718–723, 714/807; 365/200–201
See application file for complete search history.

(56) References Cited

U.S. PATENT DOCUMENTS

| | | | |
|---|---|---|---|
| 4,339,801 A * | 7/1982 | Hosaka et al. ................ | 701/102 |
| 6,216,226 B1 * | 4/2001 | Agha et al. ........................ | 713/2 |
| 6,347,386 B1 * | 2/2002 | Beffa ............................. | 714/718 |
| 6,467,056 B1 * | 10/2002 | Satou et al. .................... | 714/720 |
| 6,493,839 B1 * | 12/2002 | Miner ........................... | 714/718 |
| 6,711,703 B2 * | 3/2004 | MacLaren et al. ............. | 714/704 |
| 7,143,321 B1 * | 11/2006 | Everett et al. ................. | 714/718 |
| 7,162,625 B2 * | 1/2007 | Stern et al. ........................ | 713/2 |
| 7,356,744 B2 * | 4/2008 | Korhonen ..................... | 714/723 |
| 7,383,492 B2 * | 6/2008 | Sailer et al. ................... | 714/801 |

FOREIGN PATENT DOCUMENTS

| | | |
|---|---|---|
| JP | 4-001450 | 1/1992 |
| JP | 10-299565 | 11/1998 |
| JP | 11-316259 | 11/1999 |
| JP | 2000-207897 | 7/2000 |
| JP | 2004-133635 | 4/2004 |

* cited by examiner

*Primary Examiner* — Steve Nguyen
(74) *Attorney, Agent, or Firm* — Nixon & Vanderhye P.C.

(57) ABSTRACT

An electronic control apparatus comprises a nonvolatile memory, operating means, determining means and retrying means. The nonvolatile memory stores predetermined data and has a memory region which is divided into a plurality of sub-regions. The operating means executes a check operation for each of the sub-regions in order to check whether the data stored in the nonvolatile memory are normal or not. The determining means determines whether the check operation has detected any data errors. The retrying means allows the operating means to retry the check operation for a predetermined number of times for the sub-regions that have been determined to be in data error by the determining means.

2 Claims, 6 Drawing Sheets

FIG.7

| FIRSTLY EXECUTED FIRST CHECK OPERATION | NORMAL | DATA ERROR | DATA ERROR | DATA ERROR |
|---|---|---|---|---|
| SECOND CHECK OPERATION | — | DATA ERROR | NORMAL | NORMAL |
| SECONDLY EXECUTED FIRST CHECK OPERATION | — | — | NORMAL | DATA ERROR |
| CAUSE OF DATA ERROR | NONE | ROM | TEMPORARY | FIRST CHECK OPERATION |

ELECTRONIC CONTROL APPARATUS

CROSS-REFERENCE TO RELATED APPLICATION

This application is based on and claims the benefit of priority from earlier Japanese Patent Application No. 2009-003584 filed Jan. 9, 2009, the description of which is incorporated herein by reference.

BACKGROUND OF THE INVENTION

1. Technical Field of the Invention

The present invention relates to an electronic control apparatus which carries out data checks for a nonvolatile memory.

2. Related Art

It is known in the art to perform data check in determining whether or not an error is present in the data stored in a nonvolatile memory, such as a ROM (read only memory). For example, such data check can be performed in the form of a check sum or the like for the data stored in a nonvolatile memory, at the time of starting up the system and in the idle time of the system in operation. Reference may be made, for example, to Japanese Patent Application Laid-Open Publication Nos. 2004-133635, H10-299565 and H4-001450.

Japanese Patent Application Laid-Open Publication No. 2004-133635 discloses that, in performing data checks, a ROM region is divided into a plurality of cells, and data of a part of the cells are added up at every diagnostic period to thereby perform additions on the data in all of the cells, followed by comparing the sum of the addition values with a reference value.

Japanese Patent Application Laid-Open Publication No. 10-299565 discloses, on the other hand, that a ROM region is divided into a plurality of data groups and it is determined for each of the data groups as to whether or not the data checks have detected a data error.

Japanese Patent Application Laid-Open Publication No. 4-001450 discloses that it is determined either to perform data checks for a ROM region in its entirety, or to perform data check for each of divided regions (sub-regions) of the ROM region, according to the value of the power supply voltage.

Even when data check for a ROM detects a data error on one occasion, this single occurrence of data error may not be used as a basis for determining the occurrence of data error in the ROM, but data check may be retried several times, in order to ensure the reliability of the check operation. If, nevertheless, the several retries have resulted in a data error, then it may be determined that a data error has occurred in the ROM.

However, in the case where data check is performed by calculating a sum of the data in the entire memory region of the ROM, there is a problem that the time taken for the data check will be prolonged in case of finding a data error as a result of the data check, because in such case the data check is retried over the entire memory region of the ROM.

Further, in the case where the memory region of a ROM is divided into a plurality of regions and a data check is performed for each of the divided regions (sub-regions), there is a problem that the time taken for the data check will be prolonged if each of the retries of the data check for the ROM is performed from the beginning.

As described above, when data check has resulted in data error, the time taken for the retries of the data check will be prolonged. If such retries of the data check are performed at the time of starting up the system, for example, the time taken for starting up the system will be problematically prolonged.

In particular, vehicles in these days have a complicated control system which involves a lot of initialization items and initial checkup items at the time of starting up the vehicle system. Therefore, the lengthy time taken for the data check of the ROM will lead to a problem that the time taken for starting up the vehicle system will be prolonged and that the operation of the vehicle system will be delayed.

The present invention has been made in light of the problems described above and has as its object to provide an electronic control apparatus which is able to shorten, as much as possible, the time taken for the retries of data check performed for a nonvolatile memory in the case of data check error.

According to the present invention, an operating means performs check operation for each sub-region. With the check operation, it is checked whether the data stored in the nonvolatile memory is normal or not. If there are any sub-regions which are in data error as a result of the check operation performed by the operating means, retrying means allows the operating means to retry check operation for a predetermined number of times only for the sub-regions that have resulted in data error.

Thus, of the plurality of sub-regions, check operation is executed only for the sub-regions resulted in data error with the previous check operation. Therefore, those sub-regions which are in a normal state need not be subjected to retries of check operation. Thus, even when a data error has occurred during the data check for the nonvolatile memory, the time taken for the retries of data check can be shortened as much as possible. As a result, even when a data error has occurred during the data check executed at the time of startup or during the operation of the system, retries of the data operation can mostly be completed within a time given to the data check. Accordingly, data check for the nonvolatile memory can be executed without delaying other control in the system in which time constraints are particularly tight.

It is preferred that the operating means executes the check operation only for the sub-regions that store data to be used.

Thus, since data checking can be omitted in unused regions of the nonvolatile memory, the time taken for data check can be shortened. In particular, high efficiency can be exerted in the case where the proportion of unused regions is high.

It is preferred that, after completing a data check, the operating means selects the sub-regions that store data to be used in the subsequent process to execute the check operation.

Thus, in the case where a data check for all of the sub-regions cannot be executed at a time because of time constraints, data check can be executed for the data to be used in the subsequent process after completing the previous data check. For example, when there are time constraints at the time of starting the system, the check operation can be executed only for the sub-regions that store data to be used in the process of starting the system. Thus, the system can be started within the constrained time period.

Retries of data check for a predetermined number of times for the sub-regions in question may result in data error. In such a case, the data error is considered to be ascribed, for example, to the abnormality of the check operation per se of the electronic control apparatus having the nonvolatile memory for which the data check is executed, or to data error of the sub-regions in question. In other words, although it may be determined that the electronic control apparatus has malfunction, the cause of the malfunction cannot be identified.

It is preferred that, after the operating means has executed a first check operation as the check operation, the retrying means allows the operating means to execute a second check operation as a retry check operation, which is different from the first check operation, for the sub-regions that have been determined to be in data error by the determining means.

Thus, in the case where the first check operation has resulted in data error, check operation is retried with the second check operation which is different from the first check operation. Therefore, there is a probability that the cause of the data error resulting from the first check operation can be identified, based on the fact that the first check operation has resulted in data error and based on the results of the second check operation. When the cause of the data error resulting from the data check can be identified, the efficiency of analyzing the cause of data error can be enhanced.

It is preferred that if the second check operation for the sub-regions executed by the operating means has resulted in data error, the determining means determines that data of the sub-regions in question are in error; and if the determining means determines that the second check operation executed by the operating means has resulted in normal, the retrying means allows the operating means to retry the first check operation for the sub-regions.

In the case where both of the first and second check operations have detected a data error, the probability is considered to be low in that both of the first and second check operations are abnormal. Accordingly, in the case where both of the first and second check operations have resulted in data error, the data of the sub-regions in question of the nonvolatile memory can be determined to be in error.

Further, in the case where the second check operation has detected no errors, the data of the sub-regions in question can be considered to be normal. In this case, it is considered to be probable that the first check operation per se executed for the first time is abnormal. Therefore, retrying check operation with the first check operation, it may be determined whether or not the data error resulting from the firstly executed first check operation has been caused by the first check operation per se.

It is preferred that if the second check operation for the sub-regions executed by the operating means has resulted in no errors and if the first check operation retried by the operating means has resulted in data error, the determining means determines that the first check operation executed by the operating means is abnormal; and if the first check operation retried by the operating means has resulted in normal, the determining means determines that the sub-regions in question and the operation executed by the operating means are normal.

In the case where the second check operation has resulted in normal and retry of the first check operation has resulted in data error, the data of the sub-regions in question may be determined to be normal and the first check operation per se to be abnormal.

Also, when the second check operation has resulted in normal and retry of the first check operation has resulted in normal, the fact that the first check operation executed for the first time has resulted in data error, is considered to be only a temporal data error due to disturbance, such as noise. Accordingly, the data in the sub-regions in question and the operation performed by the operating means are considered to be normal.

Each of the functions of the plurality of means provided to the present invention is realized by a hardware resource whose configuration per se determines the function, or by a hardware resource whose function is defined by a program, or by the combination of these hardware resources. Further, the functions of the plurality of means are not limited to the functions which are realized by the hardware resources physically independent from each other.

BRIEF DESCRIPTION OF THE DRAWINGS

In the accompanying drawings:
FIG. 7 illustrates combinations of the results of different check operations, according to the second embodiment.

DETAILED DESCRIPTION OF THE PREFERRED EMBODIMENTS

With reference to the accompanying drawings, hereinafter will be described some embodiments of the present invention.

First Embodiment

Figure 1:
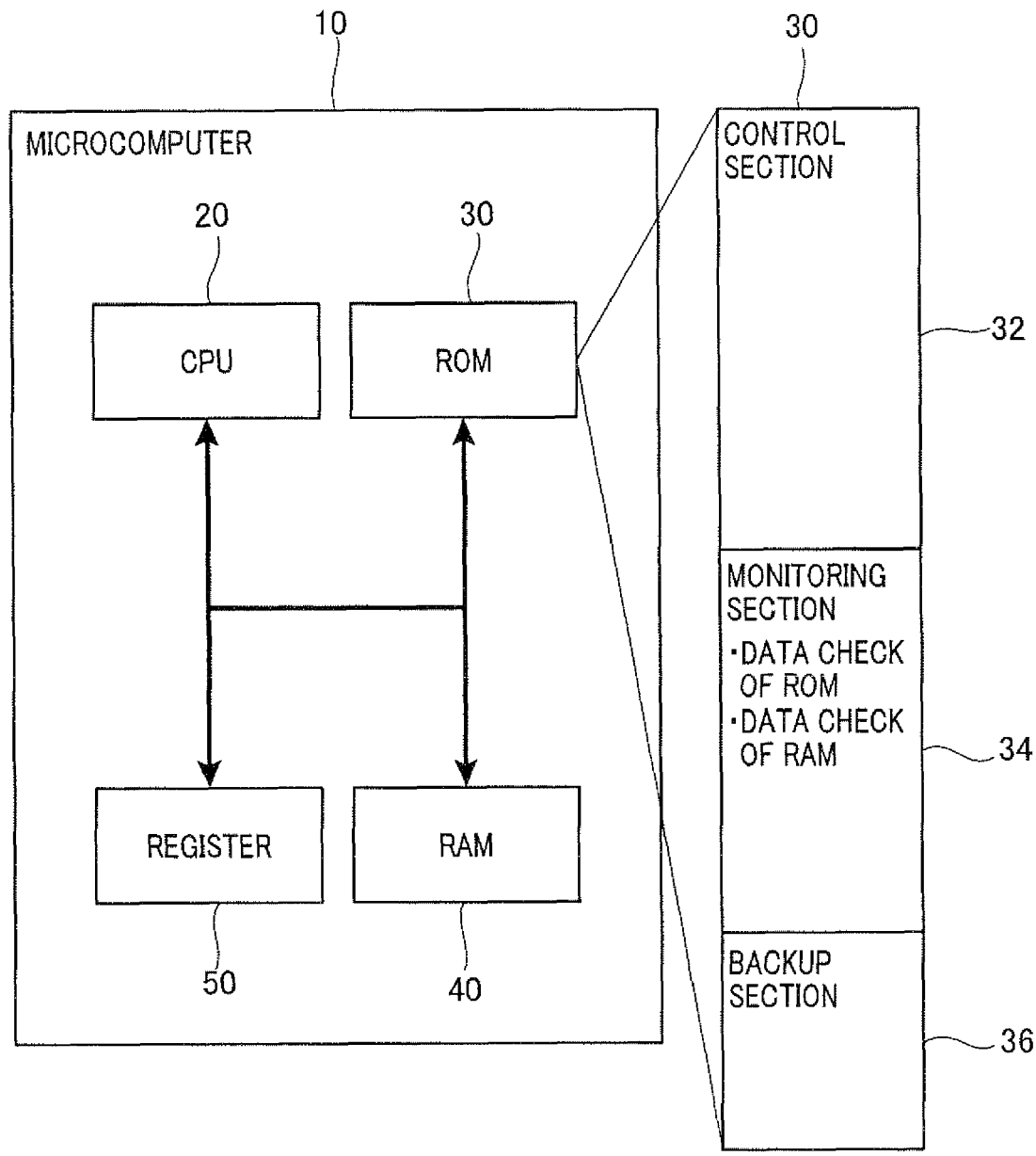
FIG. 1 is a block diagram illustrating a microcomputer, according to a first embodiment of the present invention.

FIG. 1 illustrates a microcomputer 10 according to a first embodiment of the present invention.

The microcomputer 10 serving as an electronic control apparatus is mainly configured by a CPU 20, a ROM 30, a RAM 40, a register 50 and a flash memory, not shown. The microcomputer 10 is loaded on a vehicle, for example, to control objects to be controlled, such as the fuel injection valves, the brake and the doors of the vehicle.

The CPU 20 executes a control program stored in the ROM 30 to control the objects to be controlled in the vehicle. The CPU 20 allows an ALU (arithmetic logic unit) provided in the CPU 20 to perform various operations, such as additions, subtractions, multiplications and divisions as well as logical operation.

A memory region of the ROM 30 is roughly divided into a control section 32 that stores a control program and control data to be referred to by the control program, a monitoring section 34 that stores a monitoring program and performs data checking for the ROM 30 and the RAM 40, and a backup section 36 which is not in use.

The RAM 40 provides a memory region which is used as a working space of the control program of the control section 32 and the monitoring program of the monitoring section 34.

The register 50 provides a memory region which is used by the CPU 20 for a special purpose or as a working space of calculation.

Figure 2:
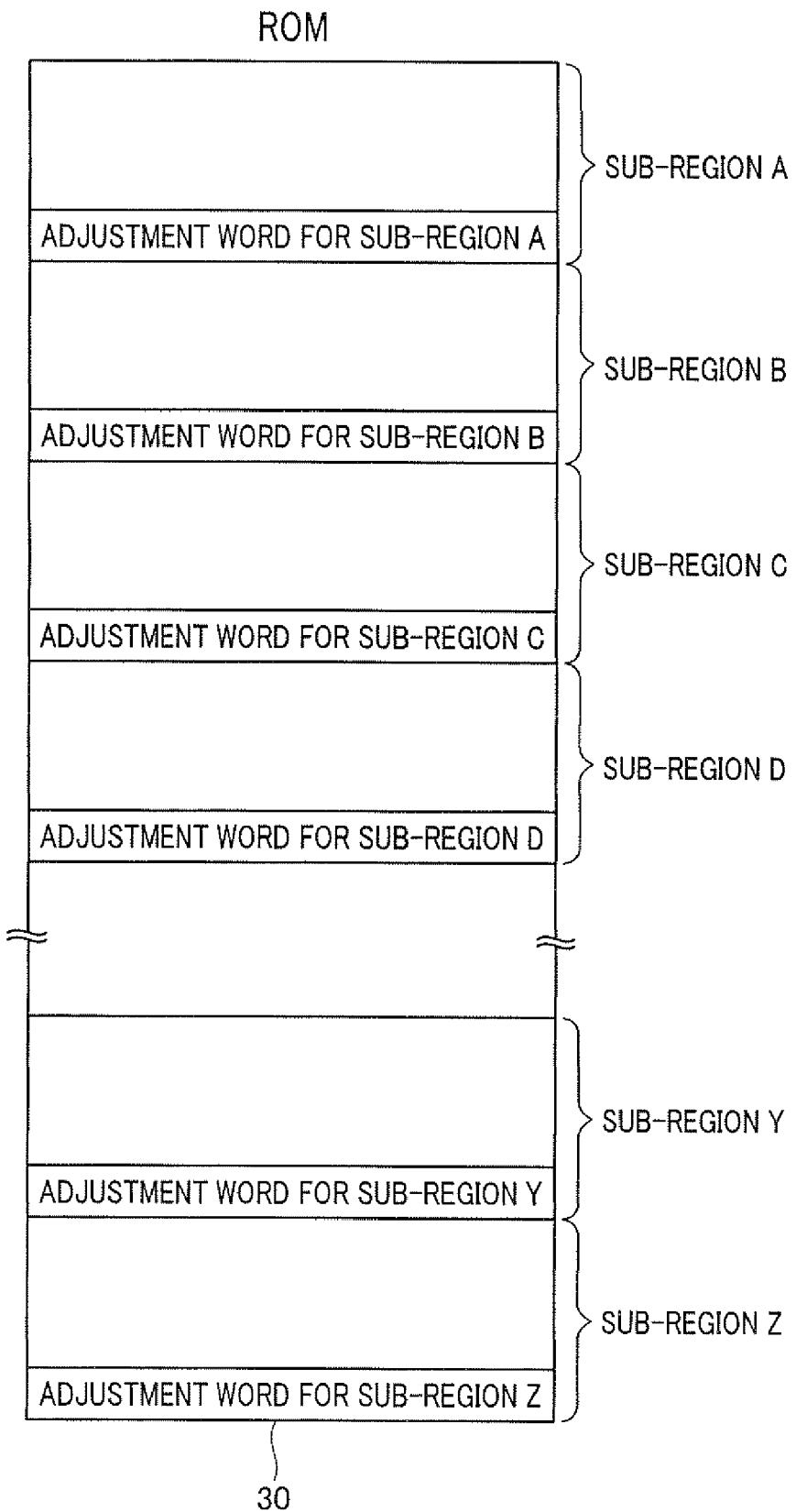
FIG. 2 is a configuration diagram illustrating sub-regions of a memory region of a ROM in the microcomputer, according to the first embodiment.

Hereinafter is described data check with which the data stored in the ROM 30 is checked as to whether or not an error is present in the data. Besides being functionally divided into the control section 32, the monitoring section 34 and the backup section 36 as mentioned above, the memory region of the ROM 30 is divided into a plurality of divided regions (hereinafter referred to as "sub-regions"), as shown in FIG. 2, each having a predetermined capacity. Although the memory region of the ROM 30 is divided into sub-regions A to Z as shown in FIG. 2, the number of divisions is not limited to this. In FIG. 2, the backup section 36 is omitted.

Each of the sub-regions has a last end portion where value of an adjustment word is stored. Each adjustment word is set so as to match a preset value when a data check operation is executed for the data of each sub-region (hereinafter, the term "data of sub-region" is also simply referred to as "sub-region data") including the adjustment word.

If each sub-region data is not in error, the results of the check operation for the sub-region data including the adjustment word should match the preset value. Additions may be used as the check operation, or other than additions, any of subtractions, multiplications, divisions and logical operation may be used.

Figure 3:
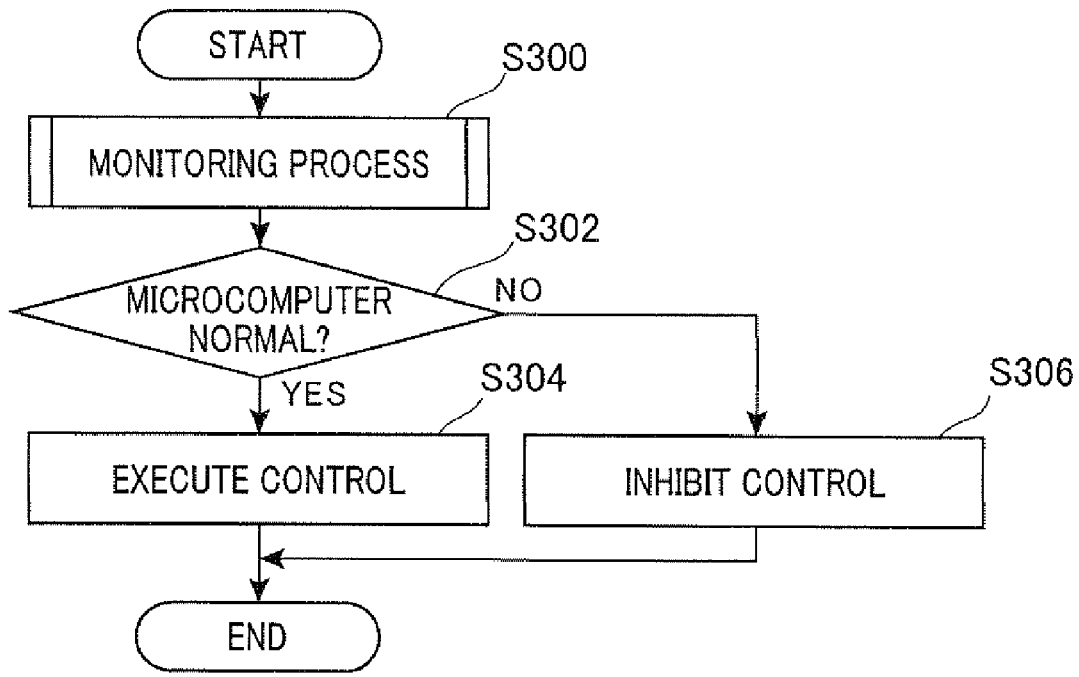
FIG. 3 is a flow diagram illustrating a main routine for monitoring the microcomputer, according to the first embodiment.
Figure 4:
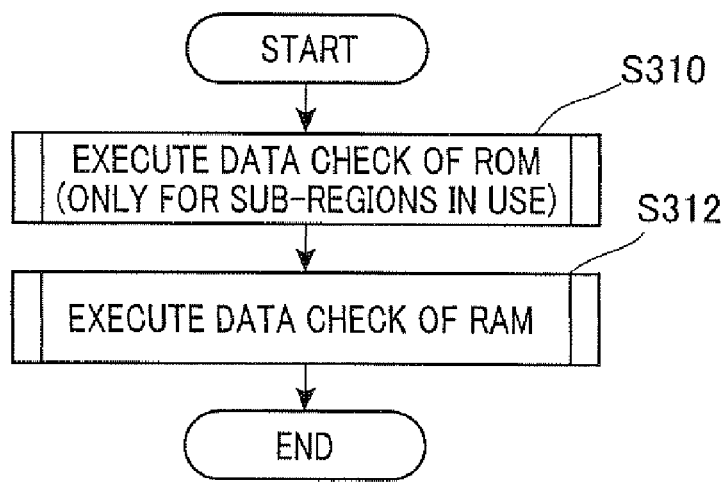
FIG. 4 is a flow diagram illustrating a routine of a microcomputer monitoring process, according to the first embodiment.
Figure 5:
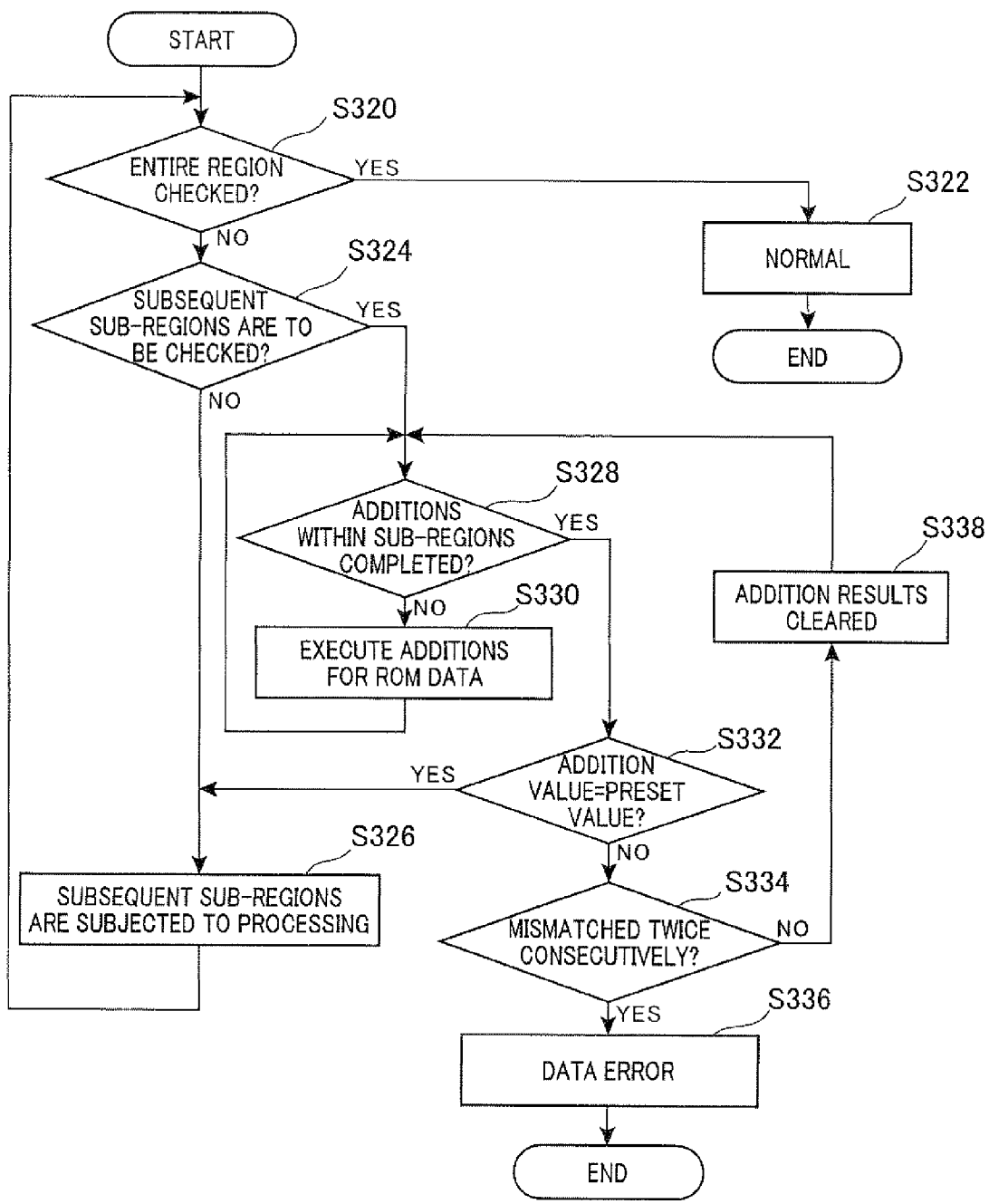
FIG. 5 is a flow diagram illustrating a data check routine 1 for the ROM in the microcomputer, according to the first embodiment.

FIGS. 3 to 5 are flow diagrams each illustrating a microcomputer monitoring routine (hereinafter just referred to as a "monitoring routine"). The microcomputer 10 functions as operating means, determining means or retrying means by allowing the CPU 20 to execute the monitoring program stored in the monitoring section 34 of the ROM 30. The monitoring routines illustrated in FIGS. 3 to 5 are executed with predetermined timing during the startup of the system or during the execution of ordinary control.

As shown in FIG. 3, in the main routine for monitoring the microcomputer, the CPU 20 executes a microcomputer monitoring process (hereinafter just referred to as a "monitoring process") at step S300. The details of the monitoring process will be described referring to FIGS. 4 and 5. As a result of performing the monitoring process, if the microcomputer 10 is in normal function ("Yes" at step S302), the CPU 20 allows execution of ordinary control, at step S304, based on the control program stored in the control section 32 and then ends the present routine. If the microcomputer 10 is malfunctioning ("No" at step S302), the CPU 20 stops the vehicle control performed by the microcomputer 10 at step S306, and then ends the present routine.

As the monitoring process at step S300 of FIG. 3, the CPU 20 executes data check of the ROM 30 indicated at step S310 and data check of the RAM 40 indicated at step S312 of FIG. 4. The data check of the ROM 30 indicated at step S310 will be described later.

At step S312, the CPU 20 writes data having a predetermined value into the RAM 40 for each word and executes data check for the RAM 40 by making judgement whether the written data having the predetermined value can be correctly read out.

Referring now to FIG. 5, the details of a data check routine 1 for the ROM 30 executed at step S310 will be described. In the data check illustrated in FIG. 5, additions are used as the check operation.

In the present embodiment, data check is executed only for the sub-regions of the ROM 30 that stores data to be used. Accordingly, the backup section 36 that is the unused region, as well as the unused sub-regions, if any, of the control section 32 and the monitoring section 34 are excluded from being subjected to data check. Whether each of the sub-regions is used or unused is indicated by a flag or the like corresponding to the sub-region.

The data check of the ROM 30, if executable within a set time period to all the sub-regions in use, may be executed at a time in the routine shown in FIG. 5. Alternatively, the data check of the ROM 30, if executable within a set time period only to a part of the sub-regions in use, may be executed a plurality of times. Whether or not each of the sub-regions has been checked is indicated by a flag or the like corresponding to the sub-region.

If not all of the sub-regions can be subjected to data check at a time because of time constraints, it is desirable, following completion of the data check, to select the sub-regions that store data to be used in the subsequent process and to execute the data check for the selected sub-regions. For example, if there are time constraints in starting up the system, check operation is executed only to the sub-regions that store data to be used in starting up the system, whereby the system can be started up without breaking time constraints.

When the system is started up, the sub-regions that have not been subjected to data check at the time of startup may be sequentially subjected to data check. As to the data check after the startup of the system as well, if there are time constraints, it is desirable, following completion of the data check, to select the sub-regions that store data to be used in the subsequent process and to execute data check for the selected sub-regions.

First, at step S320 of FIG. 5, the CPU 20 determines whether or not data check for the entire region of the ROM 30 has been completed. In this case, it may be so configured that the backup section 36 of the ROM 30 is excluded in advance from being subjected to data check.

When data check has been completed for the entire region with the occurrence of no data error ("Yes" at step S320), it is determined that the data check this time for the ROM 30 has been normally ended (step S322) and then the CPU 20 ends the present routine. It should be appreciated that the "entire region" subjected to the determination processing at step S320 corresponds to "sub-regions" which are subjected to data check this time, which, is performed within a data check time period. Accordingly, the region subjected to data check may correspond to all the sub-regions in use in the ROM 30, or may correspond to a part of the sub-regions in use, which can be subjected to data check within a set time period.

If data check for the entire region has not been completed ("No" at step S320), the CPU 20 determines, at step S324, whether or not the subsequent sub-regions are to be subjected to the data check this time, based on the flag or the like. If the subsequent sub-regions are not to be subjected to data check this time ("No" at step S324), control proceeds to step S326 where the subsequent sub-regions are subjected to the determination processing at step S320.

If the subsequent sub-regions are to be subjected to data check this time ("Yes" at step S324), the CPU 20 determines, at step S328, whether or not additions have all been completed for the sub-regions including the respective adjustment words, which are subjected to data check. If the additions for the sub-regions have not been completed ("No" at step S328), the CPU 20 carries out additions for the subsequent ROM data in the sub-regions (step S330) to perform the determination processing at step S328.

If all of the additions in the sub-regions have been completed ("Yes" at step S328), control proceeds to step S332 where the CPU 20 determines whether or not the addition value including the adjustment words of the sub-regions matches the preset value. If the addition value matches the preset value ("Yes" at step S332), control proceeds to step S326 where the CPU 20 executes data check for the subsequent sub-regions. If the addition value does not match the preset value ("No" at step S332), control proceeds to step S334 where the CPU 20 determines whether or not mismatch has occurred twice consecutively. If mismatch has occurred for the first time ("No" at step S334), the CPU 20 clears the results of the additions (step S338) and control proceeds to step S328 where data check is retried for the same sub-regions. In this case, data check is retried only for the sub-regions whose addition value does not match the preset value.

If mismatch has occurred twice consecutively ("Yes" at step S334), the CPU 20 determines data error has occurred in the ROM 30 (step S336) and ends the present routine. It should be appreciated that the number of consecutive mismatches resulting from the retries of data check in determining the occurrence of data error in the ROM 30 may not be limited to twice but may be three times or more.

In the flow diagram illustrated in FIG. 5, steps S320 to S330 correspond to the function of the microcomputer 10 as the operating means. Likewise, steps S332 to S336 correspond to the function of the microcomputer 10 as the determining means, and steps S334 and S338 correspond to the function of the microcomputer 10 as the retrying means.

In the first embodiment, the adjustment word has been provided to each of the sub-regions, with a value being set such that the results of additions of the sub-regions match the preset value. Alternative to this, without providing the adjustment word to each sub-region, it may be determined whether or not the results of an addition of data for each sub-region match an addition value obtained in advance for the sub-region.

Second Embodiment

Figure 6:
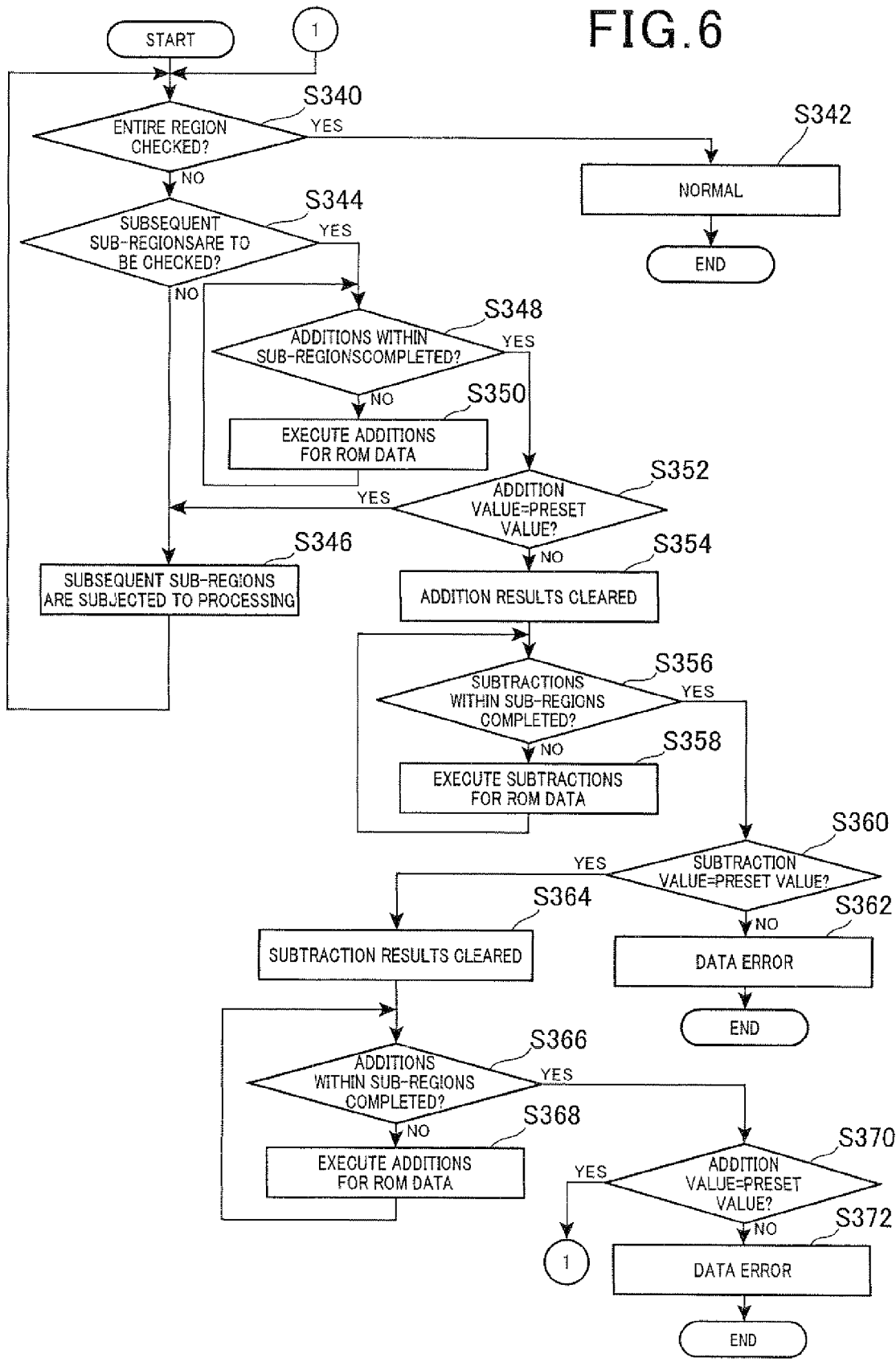
FIG. 6 is a flow diagram illustrating a data check routine 2 for the ROM, according to a second embodiment of the present invention.

Referring now to FIGS. 6 and 7, hereinafter is described a second embodiment of the present invention. In the second embodiment, the identical or similar components to those in the first embodiment are given the same reference numerals for the sake of simplifying explanation.

FIG. 6 shows the details of a data check routine 2 according to the second embodiment, which is carried out for the ROM 30 at step S310 of FIG. 4. In the first embodiment, additions of one type have been performed as a check operation for the sub-regions. Instead of this, in the second embodiment, if a first check operation results in data error, data check of the sub-regions in question is retried with a second check operation which is different from the first check operation. In the second embodiment, additions are carried out as the first check operation and subtractions are carried out as the second check operation. Further, in the second embodiment, without providing an adjustment word to each of the sub-regions, it is determined whether or not the results obtained through the execution of the check operation for each sub-region match a preset value obtained in advance through the execution of the data check for each sub-region.

Of the steps of the data check routine 2 shown in FIG. 6, steps S340 to S350 are omitted from description, for they are substantially the same as steps S320 to S330 of FIG. 5.

At step S352, the CPU 20 determines whether or not the addition value of the sub-regions matches the preset value. If the addition value matches the preset value ("Yes" at step S352), control transfers to step S346 where the CPU 20 executes data check for the subsequent sub-region. If the addition value does not match the preset value ("No" at step S352), control proceeds to step S354 where the CPU 20 clears the results of the additions.

At step S356, the CPU 20 determines whether or not subtractions as the second check operation have all been completed for the sub-regions where the firstly executed additions as the first check operation have resulted in data error. If the subtractions for the sub-regions have not been completed ("No" at step S356), the CPU 20 carries out subtractions for the subsequent ROM data in the sub-regions (step S358) to perform the determination processing at step S356.

If the subtractions in the sub-regions have all been completed ("Yes" at step S356), control proceeds to step S360 where the CPU 20 determines whether or not the subtraction value of the sub-regions matches the preset value.

If the subtraction value does not match the preset value ("No" at step S360), that is, if the additions and the subtractions executed for the sub-regions have both resulted in data error, control proceeds to step S362. At step S362, the CPU 20 determines, as shown in FIG. 7, that a data error has occurred in the sub-regions in question of the ROM 30.

If the subtraction value matches the preset value ("Yes" at step S360), control proceeds to step S364 where the CPU 20 clears the results of the subtractions. Then, control proceeds to step S366 where it is determined whether or not secondly executed additions have all been completed for the sub-regions where the subtractions have resulted in data error. If the secondly executed additions have not yet been completed for the sub-regions in question ("No" at step S366), the CPU 20 carries out additions for the subsequent ROM data in the sub-regions in question (step S368) to perform the determination processing at step S366.

If the secondly executed additions have all been completed for the sub-regions in question ("Yes" at step S366), control proceeds to step S370 where the CPU 20 determines whether or not the addition value of the sub-regions in question matches the preset value.

If the second addition value does not match the preset value ("No" at step S370), that is, if the firstly executed additions have resulted in data error and if the subsequently executed subtractions have resulted in normal, and further, if the secondly executed additions have resulted in data error, the CPU 20 determines, at step S372, as shown in FIG. 7, that the additions as the first check operation are incorrect. In this case, the addition function of the ALU in the CPU 20 is considered to be in malfunction.

If the second addition value matches the preset value ("Yes" at step S370), that is, if the firstly executed additions have resulted in data error, and if the subsequently executed subtractions have resulted in normal, and further, if the secondly executed additions have resulted in normal, the CPU 20 determines, as shown in FIG. 7, that the cause of the data error resulting from the firstly executed additions is a temporary disturbance, such as noise, and then determines that the data check for the sub-regions in question is normal. In other words, the CPU 20 determines that the data in the sub-regions in question are normal, and the additions and subtractions, i.e. the check operations performed by the CPU 20, are correct. Then, the CPU transfers to step S340.

In the second embodiment, if the first additions as the first check operation have resulted in data error, a check operation is retried without using the additions again, but using subtractions, instead of the so additions, as the second check operation. Further, if the subtractions have resulted in normal, a check operation is further retried by performing additions for the second time.

Thus, in the second embodiment, the first and second check operations, which are of different types, have been performed in combination. Therefore, if the data check conducted of the sub-regions in question has finally resulted in data error, the cause of the data check error can be determined based on the results of the first and second data operations. In this way, the analysis on the cause of data check error can be improved.

In the flow diagram illustrated in FIG. 6, steps S340 to S350, S356, S358, S366 and S368 correspond to the function of the microcomputer 10 as the operating means. Likewise, steps S352, S360, S362, S370 and S372 correspond to the function of the microcomputer 10 as the determining means. Also, steps S352 to S358, S360 and S364 to S368 correspond to the function of the microcomputer 10 as the retrying means.

In the embodiments described so far, if the data check for certain sub-regions has resulted in data error, data check is retried only for the sub-regions resulted in data error. Thus, the time required for data check including retries can be shortened as much as possible in the system in which time constraints are tight. As a result, even when a data error has occurred during the data check performed at the time of the startup or during the operation of the system, retries of the data check can mostly be completed within the time given to the data check. Accordingly, the data check for the nonvolatile memory can be executed without delaying other control in the system in which time constraints are particularly tight.

Further, even when check operation executed once has resulted in data error, the ROM data are not determined as being in error but, instead, the check operation is retried several times. Accordingly, accuracy can be improved in determining data check error.

[Modifications]

In the embodiments described above, data checking has been executed for the ROM that is a nonvolatile memory. Alternatively, data check may be executed for rewritable nonvolatile memory, such as a flash memory. In the case where data checking is executed for a rewritable nonvolatile memory, it is desirable that the data check be executed for a rewritable nonvolatile memory which is less frequently rewritten, such as when the program is updated.

In the above embodiments, data checking has been executed for only the sub-regions of the ROM 30 in which data to be used are stored. Alternatively, the entire storage region of the ROM 30, including unused sub-regions, may be subjected to data check. In this case, data of preset values may be stored in the unused sub-regions.

In the second embodiment, if the firstly executed additions have resulted in data error and if the subsequently executed subtractions have resulted in normal, additions have been performed for the second time. Alternatively, if the firstly executed additions have resulted in data error and if the subsequently executed subtractions have resulted in normal, additions may not be executed for the second time, but it may be determined that the additions are incorrect.

In the embodiments described above, the functions as the operating means, the determining means and the retrying means have been realized by the microcomputer 10 whose functions are defined by the monitoring program. Alternatively, at least a part of the functions of the plurality of means may be realized by hardware whose functions are defined by the circuit configuration per se.

As described above, the present invention is not intended to be limited to the above embodiments but may be implemented in various modes within a scope not departing from the spirit of the present invention.

What is claimed is:

1. An electronic control apparatus comprising:
a nonvolatile memory that stores predetermined data and has a memory region which is divided into a plurality of sub-regions;
operating means that executes a check operation for each of the sub-regions in order to check whether the data stored in the nonvolatile memory are normal or not;
determining means that determines whether the check operation has resulted in normal or not;
first retrying means that allows the operating means to retry a second check operation as the check operation, the second check operation being executed for the sub-region that a first check operation as the check operation has been executed for and determined to be in error, and the second check operation being different from the type of the first check operation; and
second retrying means that allows the operating means to retry the first check operation for the sub-region that the second check operation has been executed for and determined to be in normal, wherein:
if the second check operation for the sub-regions executed by the operating means has detected no errors and if the first check operation retried by the operating means has resulted in data error, the determining means determines that the first check operation executed by the operating means detected an error; and
if the first check operation retried by the operating means has resulted in normal, the determining means determines that the sub-regions in question and the operation executed by the operating means are normal.

2. A method comprising:
storing predetermined data in a nonvolatile memory that has a memory region which is divided into a plurality of sub-regions;
executing a check operation for each of the sub-regions in order to check whether the data stored in the nonvolatile memory are normal or not;
determining whether the check operation has resulted in normal or not;
retrying a second check operation as the check operation, the second check operation being executed for the sub-region, that a first check operation as the check operation has been executed for and determined to be in error, and the second check operation being different from the type of the first check operation; and
retrying the first check operation for the sub-region that the second check operation has been executed for and determined to be in normal; wherein:
if the executed second check operation for the sub-regions has detected no errors and if the retried first check operation has resulted in data error, the executed first check operation is determined as detecting an error; and
if the retried first check operation has resulted in normal, the sub-regions in question and the executed operation are determined as normal.

\* \* \* \* \*